US011509087B1

(12) United States Patent
Capitelli

(10) Patent No.: US 11,509,087 B1
(45) Date of Patent: Nov. 22, 2022

(54) ELECTRICAL CONNECTOR HAVING A BARREL ENCLOSING A COIL SPRING WHICH PUSHES ON A SPHERICAL BALL MOVABLE WITHIN THE BARREL

(71) Applicant: MILL-MAX MFG CORP., Oyster Bay, NY (US)

(72) Inventor: Stephen Capitelli, Glen Head, NY (US)

(73) Assignee: Mill-Max Mfg. Corp., Oyster Bay, NY (US)

( * ) Notice: Subject to any disclaimer, the term of this patent is extended or adjusted under 35 U.S.C. 154(b) by 27 days.

(21) Appl. No.: 17/200,516

(22) Filed: Mar. 12, 2021

Related U.S. Application Data

(60) Provisional application No. 63/004,671, filed on Apr. 3, 2020.

(51) Int. Cl.
*H01R 13/42* (2006.01)
*H01R 13/24* (2006.01)

(52) U.S. Cl.
CPC ............................ *H01R 13/2421* (2013.01)

(58) Field of Classification Search
CPC .................................................. H01R 13/2421
See application file for complete search history.

(56) References Cited

U.S. PATENT DOCUMENTS

| | | | | |
|---|---|---|---|---|
| 1,651,314 A * | 11/1927 | Beasley, Jr. | ............ | H01H 19/58 200/290 |
| 3,753,103 A * | 8/1973 | Tetreault | ............ | G01R 1/06722 439/482 |
| 4,993,957 A * | 2/1991 | Shino | ................ | H01R 13/2414 439/86 |
| 7,798,867 B2 * | 9/2010 | Sanders | ............ | G01R 1/06722 439/700 |
| 8,337,256 B1 * | 12/2012 | Lin | ..................... | H01R 12/7094 439/700 |
| 8,575,466 B2 * | 11/2013 | van Ekstrom | ........... | G10H 1/32 84/743 |
| 8,734,189 B2 * | 5/2014 | Kim | ...................... | H01R 13/08 439/700 |
| 8,926,376 B2 * | 1/2015 | Mori | ..................... | H01R 12/71 439/700 |
| 9,225,095 B2 * | 12/2015 | Van Ekstrom | ..... | H01R 13/2421 |
| 9,431,742 B2 * | 8/2016 | DiFonzo | ................ | H01R 13/17 |
| 9,780,475 B2 * | 10/2017 | Kim | ................... | H01R 13/2421 |
| 10,027,047 B1 * | 7/2018 | Lopez | ................ | H01R 13/2407 |
| 10,522,943 B1 * | 12/2019 | Termini | ................ | H01R 24/38 |

* cited by examiner

*Primary Examiner* — Neil Abrams
(74) *Attorney, Agent, or Firm* — David S. Woronoff

(57) ABSTRACT

An electrical connector having a barrel or hollow cylindrical sleeve into which is inserted a cylindrical interface member adapted to accept a coil spring member on one end thereof. The interface member on its other end acts upon a cylindrical sphere or ball captured with the other end of the sleeve member. The ball is movable axially and rotationally within the sleeve to make electrical and mechanical contact with an external surface which may be either movable with respect to the ball or not perpendicular to the ball. The connector is formed to direct current to pass primarily through the sleeve and to bypass the spring.

8 Claims, 4 Drawing Sheets

ELECTRICAL CONNECTOR HAVING A BARREL ENCLOSING A COIL SPRING WHICH PUSHES ON A SPHERICAL BALL MOVABLE WITHIN THE BARREL

This application claims the benefits of provisional patent application number 63/004,671 filed Apr. 3, 2020 in the name of the inventor of this invention.

BACKGROUND OF THE INVENTION

The background of the invention is the well known "pogo pin" connector which consists of a sleeve and spring contained within the sleeve acting on a pin which is the contact element. "Pogo pins" have been made for many years and have a successful product life so long as the contact surfaces between the tip or plunger (extending end) of the pin and the surface to be contacted are essentially parallel.

However when the contact element (surface) of the pin and the mating surface are not virtually parallel or are in motion with respect to each other, the electrical contact and mechanical performance of the pogo pin connector are not satisfactory.

A variant of the conventional "pogo pin" connector is made and sold by Federkontakte in Germany. One variant is to employ a ball in the sleeve between the spring and the contact element. The ball is used to carry current to the sleeve rather than through the spring and bias the plunger against the side of the sleeve so that current passes through the sleeve and plunger and not through the spring. Passing electrical current through the spring is not desirable because the spring exhibits high resistance and reduces the life of the connector. Another variant is to use a ball captured in a second sleeve which is inserted in the first sleeve. The ball is the contact element and both ball and second sleeve move within the first sleeve when the ball is moved by force.

The present invention solves the problem of electrically interconnecting surfaces which are not essentially parallel to the extending face of the pin connector or which are in relative motion with respect to each other. The present invention exhibits excellent electrical and mechanical performance while these misaligned or in-motion surfaces are undergoing shock and vibration. In performance the present invention exceeds all other products currently known in contact resistance, ability to perform while undergoing shock and vibration, long product life cycle and consistency of force and stroke.

Space 103, 203 and 303 allow the interface component to slide with the respective barrels 116, 216 and 316.

Figure 7:
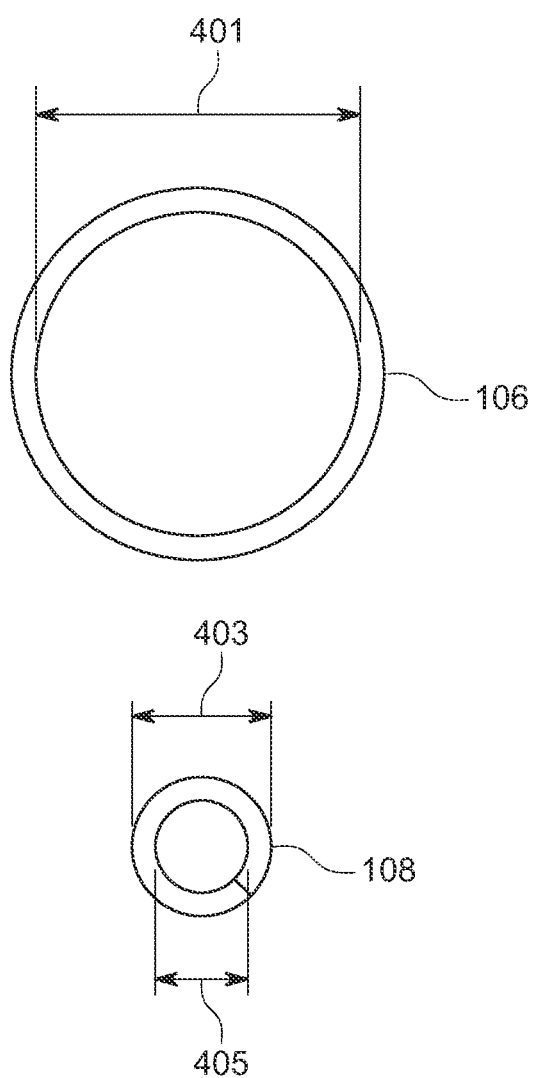

FIG. 7 is an end view of one end of the hollow cup and the cap.

DESCRIPTION OF THE INVENTION.

The present invention comprises five basic structural elements of barrel, spring, interface component, cap and sphere or ball contained within the barrel as shown in FIGS. 1 through 6. All of the aforementioned parts are electrically conductive. The functional results of this novel and inventive combination is an electrical connector that outperforms traditional connectors in applications where interconnecting components mate in either sliding or rotational motion or in a non vertical or axial orientation. The outperformance includes lower resistance connections, excellent electrical conductivity under shock and vibration and far longer life cycles by factors of up to four times the life cycle and ten times the conductivity of known electrical connectors. The enhanced physical and performance demands are present in a wide variety of automated equipment including optical components and robotics.

Figure 1:
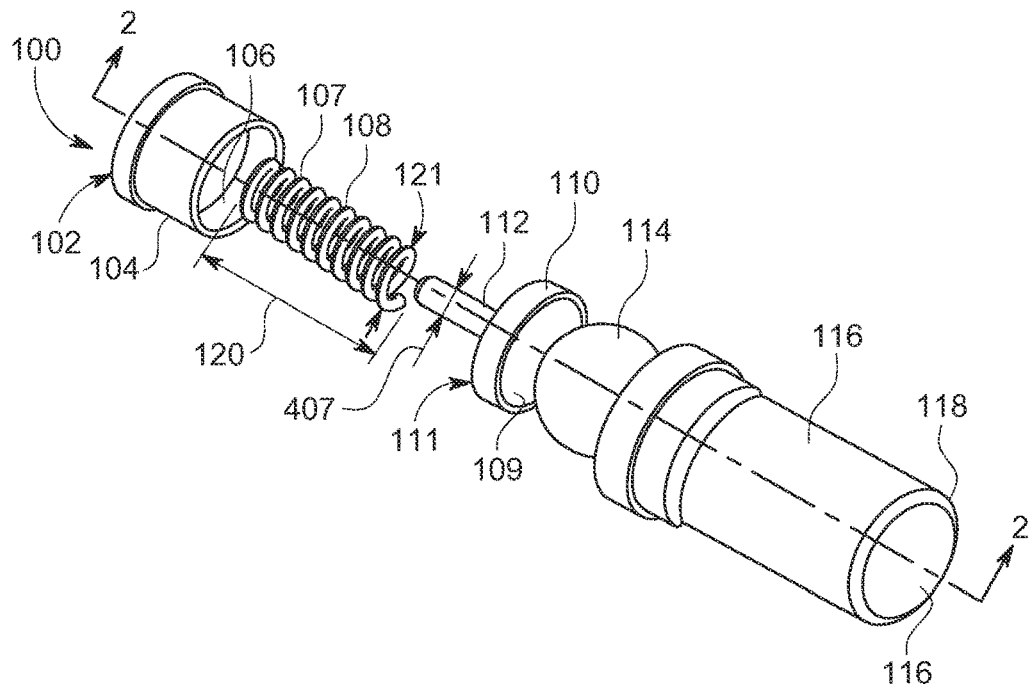
FIG. 1 is a exploded view of one embodiment of the present invention.
Figure 2:
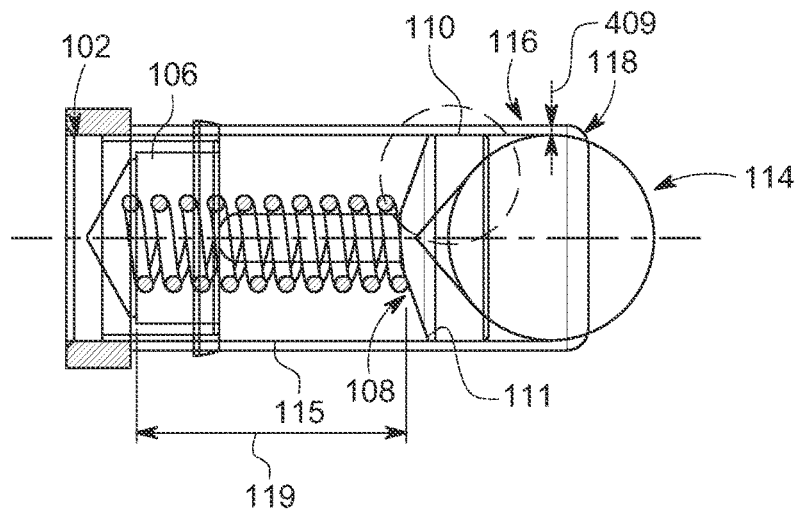
FIG. 2 is a wireframe view (unexploded) of one embodiment of the present invention shown in FIG. 2 taken along the line 2-2 shown in FIG. 1.
Figure 2A:
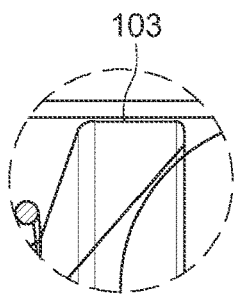
FIG. 2A is en enlarged view of the detail shown within the dotted circle in FIG. 1 to show the space 103 between the interface component 110 and the barrel 116 of the inventive connector.
Figure 3:
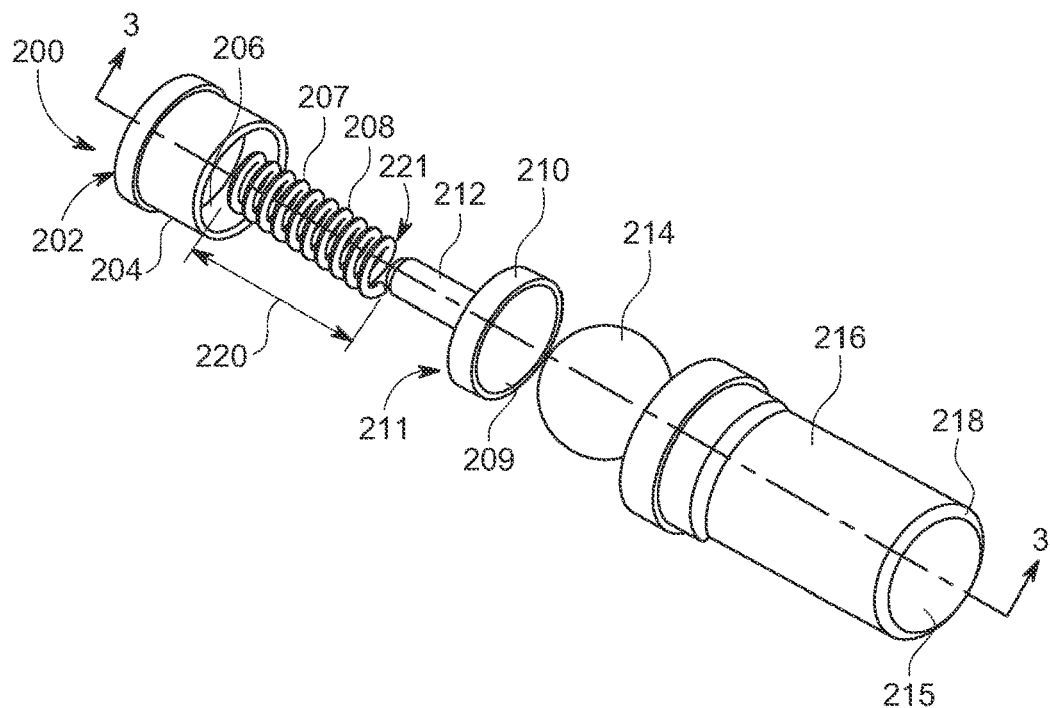
FIG. 3 is an exploded view of the embodiment shown in FIG. 4.
Figure 4:
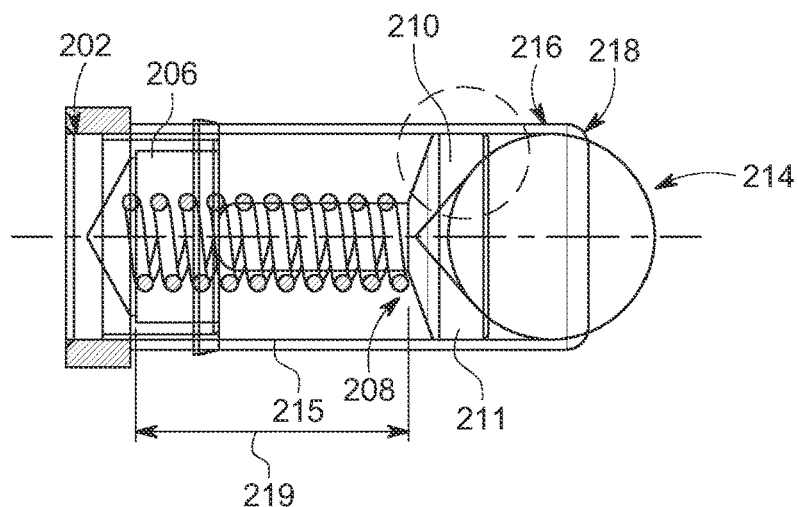
FIG. 4 is a wireframe view (unexploded) of a second embodiment of the present invention taken along the line 3-3 shown in FIG. 3.
Figure 4A:
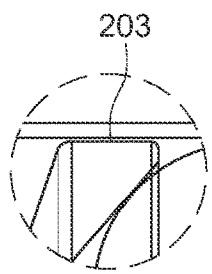
FIG. 4A is en enlarged view of the detail shown within the dotted circle in FIG. 3 to show the space 203 between the interface component 210 and the barrel 216 of the inventive connector.
Figure 5:
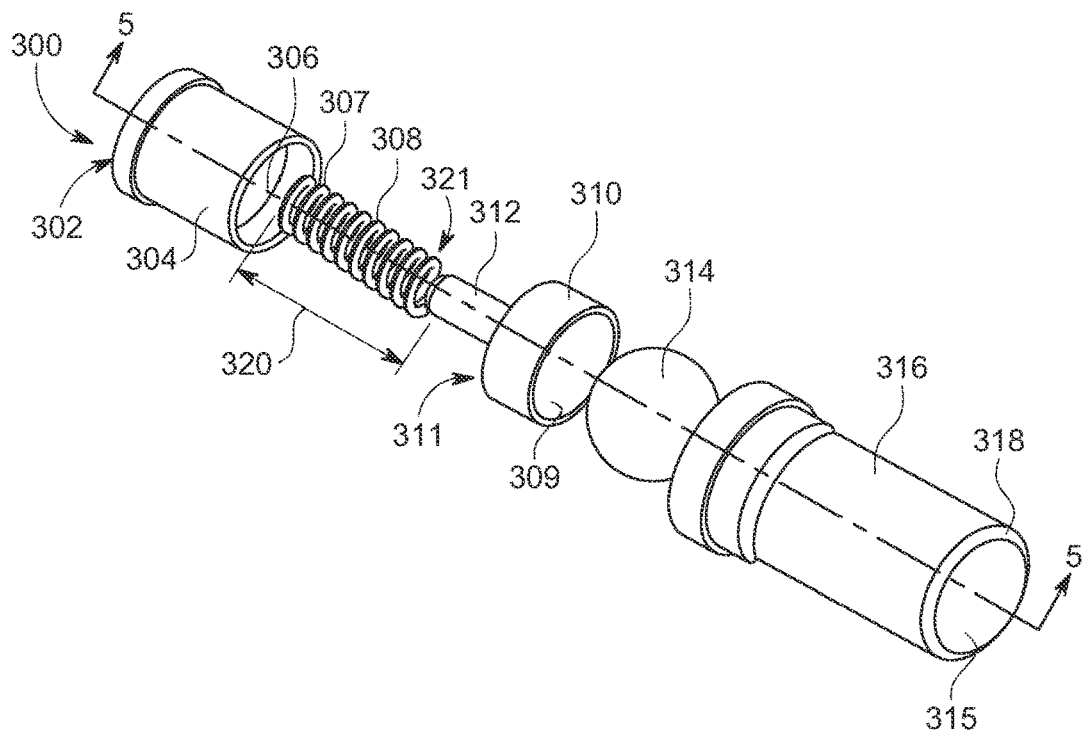
FIG. 5 is an exploded view of the embodiment shown in FIG. 6.
Figure 6:
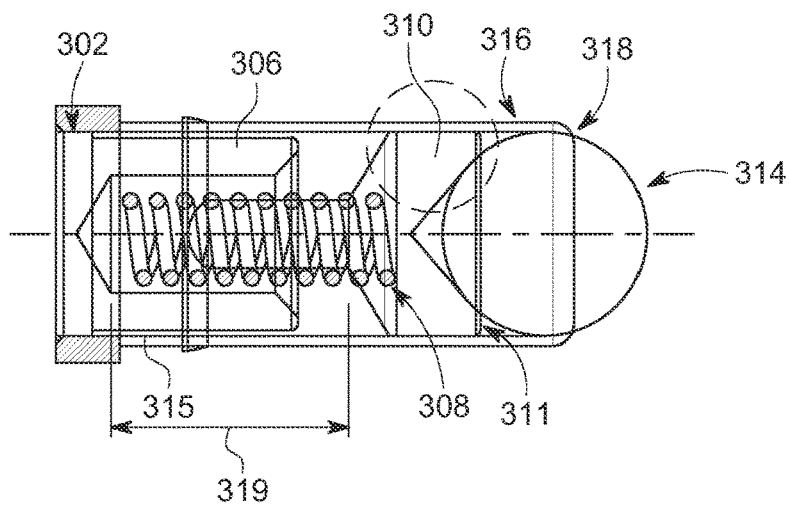
FIG. 6 is a wireframe view (unexploded) of a third embodiment of the present invention taken along the line 5-5 shown in FIG. 5.
Figure 6A:
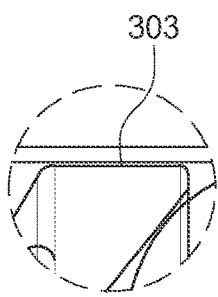
FIG. 6A is en enlarged view of the detail shown within the dotted circle in FIG. 5 to show the space 303 between the interface component 310 and the barrel 316 of the inventive connector.

Turning now to the drawings, FIGS. 1 and 2 depict one embodiment of the inventive connector. FIGS. 3 and 4 depict a second embodiment of the present invention in which similar elements to those in FIGS. 1 and 2 are indicated by a 200 series number. FIGS. 5 and 6 show a third embodiment of the present invention in which similar elements to those in FIGS. 1 and 2 are shown by a 300 series number. For example, spring elements 108, 208 and 308 are similar elements performing similar functions in each different embodiment of the invention described in more detail below.

FIG. 1 shows a exploded view of a first embodiment of the present invention having a hollow (cavity) cap 104 with a larger diameter end edge 102 both of which are of cylindrical shape. Within the cap 104 is formed a small aperture or hole 106 (spring receptor) to capture a coil spring 108 frequently made of a beryllium copper alloy with a micro plating of gold 107 over nickel. The cap 104 may have variations such as a protruding tail, solder cup, threaded post, press fit feature, ball or other terminating element to connect to a PCB, wires or other device (the barrel of the connector may have a raised diameter to get into a module) which are all well-known in the art.

The ball interface component 110 has a rearwardly extending small diameter shaft 112 leading to the cup shaped member 109 with an outer diameter essentially equal to the inner diameter of the shell or barrel 116 with sufficient separation to allow the interface cup 110 to slide within the shell 116. The inner contour 109 of the interface member mates with outer curvature of the ball or sphere shaped element 114 which is captured within the crimped edge 118 of one end of the shell or barrel 116.

The hollow outer shell (barrel) 116 encloses the spring 108, the cap 104, the interface cup 110 and shaft 112 and the ball 114. The cap 104, interface cup 110, ball 114, and barrel 116 are frequently made of a brass alloy material. All of these contacting surfaces have a micro plate gold over nickel surface for excellent electrical conductivity. The spring member biases the interface cup to one side of the shell inner surface 116 shown in FIGS. 1 and 2.

The essential differences between the three embodiments shown of the present invention relate to the relationship between the springs 108, 208 and 308, and the respective interface cup members 110, 210, 310 (particularly the shafts 112, 212, 312 of the cup members) and the respective caps 104, 204, 304. In general, the spring shown in FIGS. 1 and 2 is shorter in axial extent and larger in diameter than those springs shown in FIGS. 3 through 6.

A typical practical embodiment of the present invention has an assembled overall length of about 0.266 inches. The inner diameter 401 of the hollow cap 106 shown in FIG. 1 needs to be about 1.5 to 2 times the spring 108 outer diameter 403 shown in FIG. 7. The spring inner 405 diameter to cup post outer diameter should be in a ratio to between 1.5 to 1.83 to 1. Clearance 103 between the barrel inner diameter 110 and the cup shoulder outer diameter 111 should be about 0.002" and spring cavity length 115 shown in FIG. 2 to spring length 120 should be between 1.2 or 1.3 to 1.

The inventive concept is in part the recognition to bias (force) the interface cup 110, 210, 310 against the internal surface of the barrel 116, 216, 316 while the cup maintains constant contact with the ball. The electrical path through the inventive connector is from ball (114) to cup (110) to barrel (116) to cap (104). Importantly, this constant biasing arrangement, restricts (reduces) current flow through the spring 108 which is a high resistance element of the connector assembly and is more likely to fail in part because it its higher electrical resistance.

In FIG. 1, cup 110 is shown with a concave inner surface 109 to achieve multiple points of mechanical and electrical contact with the ball 114. The cup interface 110 has an annular shoulder 111 which slides inside the barrel 116 to which it is biased by the spring 108.

Those skilled in the art to which this invention relates can readily appreciate that many other design configurations are possible within the scope and spirit of the present invention.

The invention claimed is:

1. An electrical connector comprising in combination a hollow sleeve means having a closed and an open end, adapted at the closed end to capture a spring means, a hollow cap means and a cup interface means having first and second ends fitted within the sleeve means which encloses the cup interface means and the spring means, a rotatable ball means adapted to fit within the sleeve means and to engage one end of the cup interface means wherein the sleeve means is adapted at one end thereof to capture the rotatable ball means such that the spring means presses against the cap means on one end thereof and the cup interface means on the other end thereof to force the ball means into mechanical and electrical contact with the sleeve means such that when energized nearly all electrical current will pass through the sleeve means and not through the spring means, the cap means, cup means, sleeve means, cup interface means and ball means being electrically conductive.

2. An electrical connector comprising in combination a hollow sleeve means having a closed and an open end, adapted at the closed end to capture a spring means, a hollow cap means and a cup interface means having first and second ends fitted within the sleeve means which encloses the cup interface means and the spring means, a rotatable ball means adapted to fit within the sleeve means and to engage one end of the cup interface means wherein the sleeve means is adapted at one end thereof to capture the rotatable ball means such that the spring means presses against the cap means on one end thereof and the cup interface means on the other end thereof to force the ball means into mechanical and electrical contact with the sleeve means, the cap means, cup means, sleeve means, cup interface means and ball means being electrically conductive wherein the sleeve means inner diameter and cup means outer diameter and essentially equal.

3. An electrical connector comprising in combination a hollow cylindrical conductive sleeve member having an open end and a closed end, the closed end adapted to retain a spring member, a coil spring member and a hollow cylindrical cap member formed in a cup shape on one end thereof with a axially extending portion on the other end thereof to fit within the coil spring member and a ball member rotatable within the cup shape of the interface member and captured within the cylindrical sleeve member wherein all of the claimed members are electrically conductive wherein the coil spring forces and holds the interface member cup shaped portion into physical and electrical contact with the sleeve member and the ball member.

4. The electrical connector claimed in claim 3 wherein the sleeve member inner diameter and the cup member outer diameter are essentially equal.

5. The electrical connector claimed in claim 3 wherein the electrical current when power is applied to the connector is virtually entirely from the cup member to the sleeve member to the ball member.

6. The electrical connector claimed in claim 3 for connecting to an external conductive means wherein the rotatable member captured within the cylindrical sleeve member extends outwardly from the cylindrical sleeve member in a direction away from the spring member to be able to make rolling contact with the external conductive means.

7. The electrical connector claimed in claim 3 wherein the ball member acts against the cup interface member to press it into mechanical and electrical contact with the sleeve member requiring more electrical current passed by the connector to pass outside of the coil spring member.

8. The electrical connector claimed in claim 3 wherein tClaimhe cup interface member has a portion thereof with a concave inner surface for mating with the ball member and another portion thereof with an annular surface sliding within the sleeve member.

* * * * *

UNITED STATES PATENT AND TRADEMARK OFFICE
CERTIFICATE OF CORRECTION

PATENT NO. : 11,509,087 B1
APPLICATION NO. : 17/200516
DATED : November 22, 2022
INVENTOR(S) : Stephen Capitelli It is certified that error appears in the above-identified patent and that said Letters Patent is hereby corrected as shown below:

In the Claims

Column 4, Line 19, "and" second occurrence should be -- are --.

Column 4, Line 53, "tClaimhe" should be -- the --.

Signed and Sealed this
Twenty-fourth Day of January, 2023

Katherine Kelly Vidal
*Director of the United States Patent and Trademark Office*